United States Patent
Okabe

(10) Patent No.: US 10,361,473 B2
(45) Date of Patent: Jul. 23, 2019

(54) BIDIRECTIONAL COUPLER

(71) Applicant: Murata Manufacturing Co., Ltd., Kyoto (JP)

(72) Inventor: Hiroshi Okabe, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/152,698

(22) Filed: Oct. 5, 2018

(65) Prior Publication Data

US 2019/0109363 A1    Apr. 11, 2019

(30) Foreign Application Priority Data

Oct. 6, 2017    (JP) .................................. 2017-196320

(51) Int. Cl.
*H03H 7/38* (2006.01)
*H01P 1/24* (2006.01)
*H01P 5/18* (2006.01)

(52) U.S. Cl.
CPC ................. *H01P 5/18* (2013.01); *H01P 1/24* (2013.01); *H03H 7/38* (2013.01)

(58) Field of Classification Search
CPC combination set(s) only.
See application file for complete search history.

(56) References Cited

U.S. PATENT DOCUMENTS

| 9,866,244 B2* | 1/2018 | Srirattana ............ H04B 1/0057 |
| 10,044,341 B2* | 8/2018 | Na ........................... H01L 23/66 |
| 2013/0293316 A1 | 11/2013 | Kitching et al. |
| 2016/0172737 A1 | 6/2016 | Srirattana et al. |

* cited by examiner

*Primary Examiner* — An T Luu
(74) *Attorney, Agent, or Firm* — Pearne & Gordon LLP

(57) ABSTRACT

A bidirectional coupler includes a first main line that transmits a first signal from a first input end thereof to a first output end thereof, a second main line that transmits a second signal from a second input end thereof to a second output end thereof, a first sub-line having a first end corresponding to the first input end and a second end corresponding to the first output end, a second sub-line having a first end corresponding to the second input end and a second end corresponding to the second output end, a detector port, a termination circuit, and a switch circuit. The first end of the first sub-line and the first end of the second sub-line are connected to each other.

18 Claims, 6 Drawing Sheets

US 10,361,473 B2

BIDIRECTIONAL COUPLER

This application claims priority from Japanese Patent Application No. 2017-196320 filed on Oct. 6, 2017. The content of this application is incorporated herein by reference in its entirety.

BACKGROUND

The present disclosure relates to a bidirectional coupler. Wireless communication devices such as cellular phones include detector circuits to detect signal levels. For example, U.S. Patent Application Publication No. 2013/0293316 discloses a detector coupler capable of detecting signals transmitted on two different main lines by using a single sub-line.

In the configuration disclosed in U.S. Patent Application Publication No. 2013/0293316, a termination circuit is connected only on the output end side of the sub-line. Thus, it is possible to detect signals propagating from the input end side to the output end side of the main lines, whereas it is difficult to detect signals propagating from the output side to the input side. In the disclosed configuration, therefore, it is difficult to detect the level of, for example, a reflected signal obtained by reflecting a transmit signal from an antenna.

BRIEF SUMMARY

Accordingly, the present disclosure provides a bidirectional coupler capable of detecting bidirectional signals by using a single detector line.

According to embodiments of the present disclosure, a bidirectional coupler includes a first main line having a first input end and a first output end and configured to transmit a first signal from the first input end to the first output end, a second main line having a second input end and a second output end and configured to transmit a second signal from the second input end to the second output end, a first sub-line electromagnetically coupled to the first main line, the first sub-line having a first end corresponding to the first input end and a second end corresponding to the first output end, a second sub-line electromagnetically coupled to the second main line, the second sub-line having a first end corresponding to the second input end and a second end corresponding to the second output end, a detector port, a termination circuit, and a switch circuit that switches connection of the second end of the first sub-line and the second end of the second sub-line to the detector port or to the termination circuit in accordance with an operation mode. The first end of the first sub-line and the first end of the second sub-line are connected to each other. The operation mode includes a first operation mode for detecting the first signal, a second operation mode for detecting a reflected signal of the first signal, a third operation mode for detecting the second signal, and a fourth operation mode for detecting a reflected signal of the second signal. In the first operation mode or the fourth operation mode, the switch circuit connects the second end of the first sub-line to the termination circuit and connects the second end of the second sub-line to the detector port. In the second operation mode or the third operation mode, the switch circuit connects the second end of the first sub-line to the detector port and connects the second end of the second sub-line to the termination circuit.

According to embodiments of the present disclosure, a bidirectional coupler includes a first main line having a first input end and a first output end and configured to transmit a first signal from the first input end to the first output end, a second main line having a second input end and a second output end and configured to transmit a second signal from the second input end to the second output end, a first sub-line electromagnetically coupled to the first main line, the first sub-line having a first end corresponding to the first input end and a second end corresponding to the first output end, a second sub-line electromagnetically coupled to the second main line, the second sub-line having a first end corresponding to the second input end and a second end corresponding to the second output end, a detector port, a termination circuit, and a switch circuit that switches connection of the first end of the first sub-line and the first end of the second sub-line to the detector port or to the termination circuit in accordance with an operation mode. The second end of the first sub-line and the second end of the second sub-line are connected to each other. The operation mode includes a first operation mode for detecting the first signal, a second operation mode for detecting a reflected signal of the first signal, a third operation mode for detecting the second signal, and a fourth operation mode for detecting a reflected signal of the second signal. In the first operation mode or the fourth operation mode, the switch circuit connects the first end of the first sub-line to the detector port and connects the first end of the second sub-line to the termination circuit. In the second operation mode or the third operation mode, the switch circuit connects the first end of the first sub-line to the termination circuit and connects the first end of the second sub-line to the detector port.

According to embodiments of the present disclosure, it may be possible to provide a bidirectional coupler capable of detecting bidirectional signals by using a single detector line.

Other features, elements, characteristics and advantages of the present disclosure will become more apparent from the following detailed description of embodiments of the present disclosure with reference to the attached drawings.

DETAILED DESCRIPTION

The following describes embodiments of the present disclosure with reference to the drawings. The same or substantially the same elements are assigned the same numerals and will not be described repeatedly.

Figure 1:
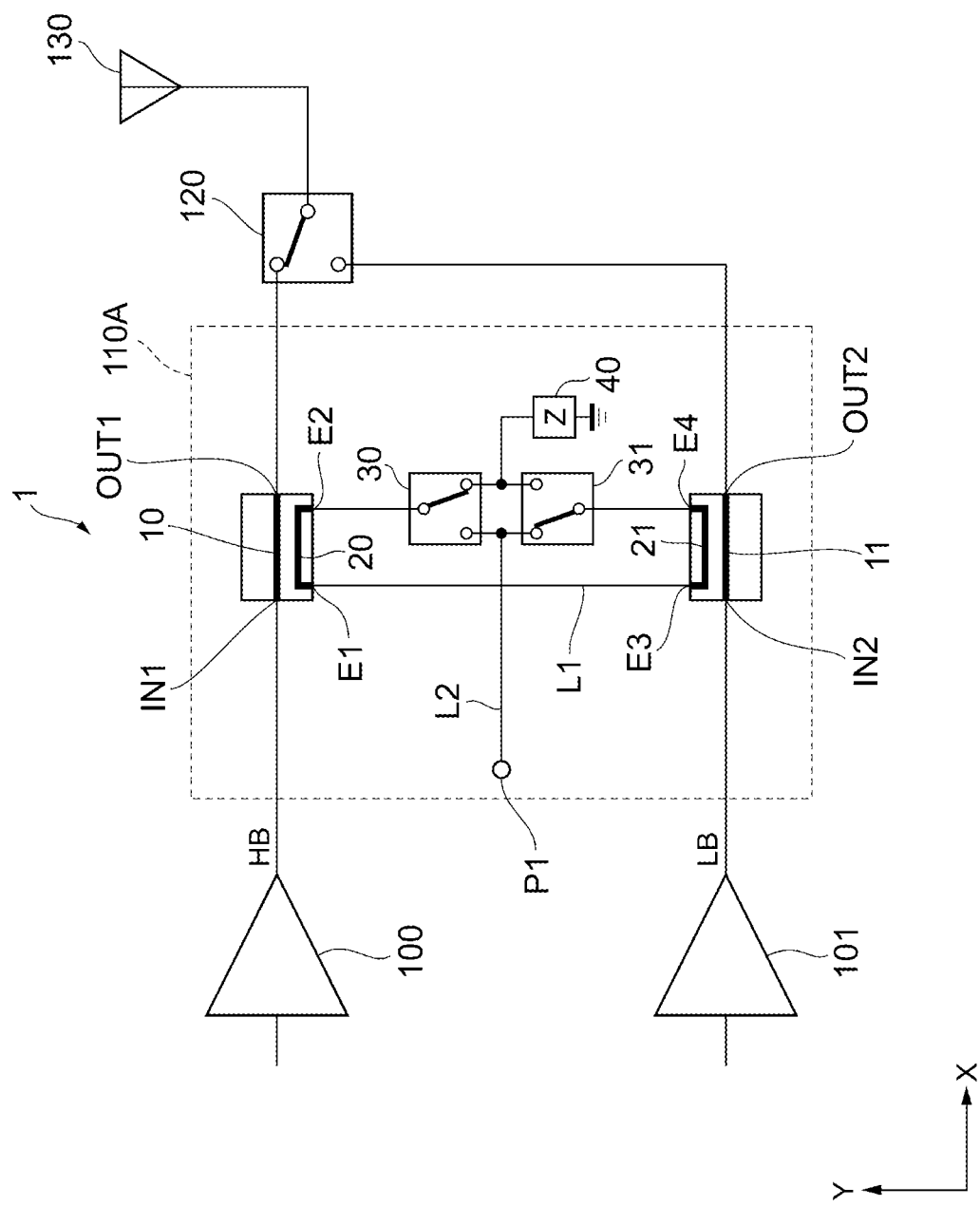
FIG. 1 illustrates an example configuration of a transmission unit including a bidirectional coupler according to a first embodiment of the present disclosure.

FIG. 1 illustrates an example configuration of a transmission unit including a bidirectional coupler according to a first embodiment of the present disclosure. Referring to FIG.

1, a transmission unit 1 is mounted in, for example, a mobile communication device such as a cellular phone and is used to amplify the power of a radio-frequency (RF) signal to be transmitted to a base station and to transmit the resulting RF signal. For example, the transmission unit 1 amplifies the power of signals conforming to communication standards such as the second-generation mobile communication system (2G), the third-generation mobile communication system (3G), the fourth-generation mobile communication system (4G), the fifth-generation mobile communication system (5G), Long Term Evolution Frequency Division Duplex (LTE-FDD), LTE Time Division Duplex (LTE-TDD), LTE-Advanced, and LTE-Advanced Pro and transmits the amplified signals. An RF signal has a frequency of about several hundreds of megahertz (MHz) to several gigahertzes (GHz), for example. The communication standards and frequencies of signals to be transmitted by the transmission unit 1 are not limited to those described above.

The transmission unit 1 includes, for example, amplifiers 100 and 101, a bidirectional coupler 110A, a switch circuit 120, and an antenna 130.

For example, the amplifiers 100 and 101 amplify the power of RF signals in different frequency ranges and output the amplified signals. The frequency ranges to be amplified by the amplifiers 100 and 101 are not limited to specific ones. In the following description, the amplifier 100 amplifies a high-band RF signal, and the amplifier 101 amplifies a low-band RF signal. The amplifiers 100 and 101 may be simultaneously in an on state or may be switched so that both amplifiers are not simultaneously in an on state in such a manner that when one of the amplifiers 100 and 101 is in an on state, the other amplifier is in an off state. The frequency ranges of signals to be amplified by the amplifiers 100 and 101 are examples and are not limited to high-band and low-band frequency ranges. For example, instead of high-band and low-band signals, high-band and middle-band signals may be amplified.

The bidirectional coupler 110A is a circuit for detecting the high-band signal output from the amplifier 100 and the low-band signal output from the amplifier 101. The configuration of the bidirectional coupler 110A will be described in detail below.

The high-band and low-band transmit signals are output to the antenna 130 via the switch circuit 120 and are transmitted to a base station (not illustrated) from the antenna 130.

The following describes a specific configuration of the bidirectional coupler 110A. The bidirectional coupler 110A is capable of bidirectional detection of transmit signals output from the amplifiers 100 and 101 to the antenna 130 (hereinafter referred to also as "traveling waves") and reflected signals returning from the antenna 130 toward the amplifiers 100 and 101 (hereinafter referred to also as "reflected waves"). In the following, an operation mode for detecting a traveling wave is referred to as a "forward operation mode", and an operation mode for detecting a reflected wave is referred to also as a "reverse operation mode". The bidirectional coupler 110A includes, for example, main lines 10 and 11, sub-lines 20 and 21, switch circuits 30 and 31, a detector port P1, and a termination circuit 40.

The main line 10 (first main line) is a line having an input end IN1 (first input end) and an output end OUT1 (first output end) and transmits a high-band transmit signal (first signal), which is output from the amplifier 100, from the input end IN1 to the output end OUT1. The main line 10 further transmits a reflected signal of the transmit signal from the output end OUT1 to the input end IN1.

The main line 11 (second main line) is a line having an input end IN2 (second input end) and an output end OUT2 (second output end) and transmits a low-band transmit signal (second signal), which is output from the amplifier 101, from the input end IN2 to the output end OUT2. The main line 11 further transmits a reflected signal of the transmit signal from the output end OUT2 to the input end IN2.

The sub-line 20 (first sub-line) is a line that forms a coupler together with the main line 10. That is, the sub-line 20 is electromagnetically coupled to the main line 10 and transmits a signal corresponding to a signal transmitted on the main line 10. The sub-line 20 has one end E1 corresponding to the input end IN1 of the main line 10 and another end E2 corresponding to the output end OUT1 of the main line 10.

The sub-line 21 (second sub-line) is a line that forms a coupler together with the main line 11. That is, the sub-line 21 is electromagnetically coupled to the main line 11 and transmits a signal corresponding to a signal transmitted on the main line 11. The sub-line 21 has one end E3 corresponding to the input end IN2 of the main line 11 and another end E4 corresponding to the output end OUT2 of the main line 11.

In this embodiment, the one end E1 of the sub-line 20 is connected to the one end E3 of the sub-line 21. That is, the sub-lines 20 and 21 are portions of a single detector line L1, and both a traveling wave and a reflected wave are detected by using the detector line L1. The detector line L1 is a line extending from the switch circuit 30 to the switch circuit 31 through the other end E2 and the one end E1 of the sub-line 20 and the one end E3 and the other end E4 of the sub-line 21. The detector line L1 has an end (i.e., the other end E2 of the sub-line 20) connected to an input terminal of the switch circuit 30 and another end (i.e., the other end E4 of the sub-line 21) connected to an input terminal of the switch circuit 31.

The switch circuits 30 and 31 are each a single-pole double-throw (SPDT) switch. The switch circuits 30 and 31 electrically connect the other end E2 of the sub-line 20 and the other end E4 of the sub-line 21 to the detector port P1 or the termination circuit 40 in accordance with a control signal supplied from outside the bidirectional coupler 110A. One of output terminals of the switch circuit 30 and one of output terminals of the switch circuit 31 are connected to the detector port P1 via a line L2.

Specifically, when the bidirectional coupler 110A is in an operation mode (first operation mode) for detecting a high-band traveling wave, the output terminal of the switch circuit 30 is switched to the termination circuit 40 side, and the output terminal of the switch circuit 31 is switched to the detector port P1 side (see FIG. 1). Thus, the one end E1 of the sub-line 20 is connected to the detector port P1 via the other sub-line 21, the switch circuit 31, and the line L2. The other end E2 of the sub-line 20 is connected to the termination circuit 40 via the switch circuit 30. In contrast, when the bidirectional coupler 110A is in an operation mode (second operation mode) for detecting a high-band reflected wave, the output terminal of the switch circuit 30 is switched to the detector port P1 side, and the output terminal of the switch circuit 31 is switched to the termination circuit 40 side. Thus, the one end E1 of the sub-line 20 is connected to the termination circuit 40 via the other sub-line 21 and the switch circuit 31. The other end E2 of the sub-line 20 is connected to the detector port P1 via the switch circuit 30 and the line L2.

When the bidirectional coupler 110A is in an operation mode (third operation mode) for detecting a low-band traveling wave, the output terminal of the switch circuit 30 is switched to the detector port P1 side, and the output terminal of the switch circuit 31 is switched to the termination circuit 40 side. Thus, the one end E3 of the sub-line 21 is connected to the detector port P1 via the other sub-line 20, the switch circuit 30, and the line L2. The other end E4 of the sub-line 21 is connected to the termination circuit 40 via the switch circuit 31. In contrast, when the bidirectional coupler 110A is in an operation mode (fourth operation mode) for detecting a low-band reflected wave, the output terminal of the switch circuit 30 is switched to the termination circuit 40 side, and the output terminal of the switch circuit 31 is switched to the detector port P1 side (see FIG. 1). Thus, the one end E3 of the sub-line 21 is connected to the termination circuit 40 via the other sub-line 20 and the switch circuit 30. The other end E4 of the sub-line 21 is connected to the detector port P1 via the switch circuit 31 and the line L2.

The detector port P1 is a port from which a detection signal of any one of the high-band traveling wave and reflected wave and the low-band traveling wave and reflected wave is output in accordance with the operation mode described above. Although not illustrated in FIG. 1, the detector port P1 is further connected to a detector circuit for detecting a signal level, for example.

The termination circuit 40 has a predetermined impedance value Z. The termination circuit 40 connects the other end E2 of the sub-line 20 or the other end E4 of the sub-line 21 to ground, or connects the one end E1 of the sub-line 20 to ground via the other sub-line 21 and the switch circuit 31 or connects the one end E3 of the sub-line 21 to ground via the other sub-line 20 and the switch circuit 30. This suppresses the reflection of a detection signal at termination. The impedance value Z of the termination circuit 40 may be fixed or variable.

As described above, using the switch circuits 30 and 31, the bidirectional coupler 110A can switch the connection of both ends of the detector line L1. Thus, the bidirectional coupler 110A can detect bidirectional (forward and reverse) signals in two frequency ranges by using the single detector line L1.

The transmission unit 1 may include a diplexer, instead of the switch circuit 120, between the low-band and high-band paths and the antenna 130 to allow a signal in the low-band frequency range and a signal in the high-band frequency range to pass through the diplexer. Alternatively, the transmission unit 1 may include, instead of the switch circuit 120 and the antenna 130, separate antennas, namely, an antenna for the low band and an antenna for the high band. The configurations described above enable time-division detection of low-band and high-band signals by switching the switch circuits 30 and 31 in the bidirectional coupler 110A by time while simultaneously operating the amplifier 100 for the high band and the amplifier 101 for the low band.

Specifically, for example, a directional coupler including the main line 10 and the sub-line 20 and a directional coupler including the main line 11 and the sub-line 21 have each a degree of coupling of 20 dB. In this case, for example, when the switch circuit 30 connects the other end E2 of the sub-line 20 to the termination circuit 40 and the switch circuit 31 connects the other end E4 of the sub-line 21 to the detector port P1 (see FIG. 1), the signal power output from the amplifier 100 appears at the one end E1 of the sub-line 20 with attenuation of 20 dB and is output from the detector port P1 via the sub-line 21. On the other hand, the signal power output from the amplifier 101 appears at the one end E3 of the sub-line 21 with attenuation of 20 dB and is terminated by the termination circuit 40 via the sub-line 20. In this manner, the signal power output from the amplifier 101 is not reflected from the termination circuit 40 if the impedance value Z of the termination circuit 40 is appropriate, and is thus not directed to the detector port P1. That is, even when the amplifiers 100 and 101 are concurrently operating, the transmission unit 1 can detect only the signal power of the desired frequency range. Therefore, for example, even when the transmission unit 1 supports carrier aggregation technology, the transmission unit 1 is not required to include respective directional couplers for the amplifiers 100 and 101, resulting in a circuit size being reduced.

For example, if the directivity of the directional coupler including the main line 11 and the sub-line 21 deteriorates, the signal power output from the amplifier 101 also appears at the other end E4 of the sub-line 21 and is output to the detector port P1. In this case, it is difficult to separate the signal power output from the amplifier 100 and the signal power output from the amplifier 101. In this configuration, therefore, it is important that the directivity of the directional coupler including the main line 10 and the sub-line 20 and the directivity of the directional coupler including the main line 11 and the sub-line 21 be kept high. As illustrated in the following embodiments, for example, making the impedance value Z of the termination circuit 40 adjustable comparatively easily achieves an improvement in directivity.

The following describes the arrangement of constituent elements included in the bidirectional coupler 110A. FIG. 1 illustrates a circuit diagram of the bidirectional coupler 110A and also illustrates an overview of the arrangement of the constituent elements. This also applies to FIGS. 2 to 6 below.

As illustrated in FIG. 1, the bidirectional coupler 110A is formed on, for example, a semiconductor chip (not illustrated). The semiconductor chip is mounted on a substrate (not illustrated). The semiconductor chip has a principal surface parallel to a plane defined by an X axis and a Y axis perpendicular to the X axis. On the semiconductor chip, the main line 10 and the main line 11 are arranged approximately parallel to each other such that the direction of travel of a high-band traveling wave and the direction of travel of a low-band traveling wave are substantially identical (i.e., the direction of the positive X-axis). That is, in FIG. 1, the amplifiers 100 and 101 are located on the negative X-axis side of the bidirectional coupler 110A, and the switch circuit 120 and the antenna 130 are located on the positive X-axis side of the bidirectional coupler 110A in such a manner as to face the amplifiers 100 and 101. The sub-line 20 and the sub-line 21 are located in an area extending along the Y axis between the main line 10 and the main line 11 such that the sub-lines 20 and 21 are close to the main lines 10 and 11, respectively. The switch circuits 30 and 31, the termination circuit 40, and the detector port P1 are located in an area extending along the Y axis between the sub-line 20 and the sub-line 21. Specifically, the termination circuit 40 is located on the side of the switch circuits 30 and 31 in the direction of travel of a traveling wave (i.e., on the positive X-axis side of the switch circuits 30 and 31), and the detector port P1 is located on the side of the switch circuits 30 and 31 in a direction opposite to the direction of travel of a traveling wave (i.e., on the negative X-axis side of the switch circuits 30 and 31).

With the arrangement described above, in the bidirectional coupler 110A, the sub-lines 20 and 21 are located in an area between the main lines 10 and 11. This arrangement prevents the main lines 10 and 11 from crossing the detector line L1 on the semiconductor chip. Typically, if a plurality of lines cross, coupling between lines may cause a signal transmitted on one of the lines to leak into the other line and to affect a signal transmitted on the other line, which is inconvenient. In this embodiment, since the main lines 10 and 11 do not cross the detector line L1, high directivity can be more easily maintained than in a configuration in which a main line crosses a detector line. Thus, detection accuracy can be improved.

In the bidirectional coupler 110A, furthermore, the one end E1 of the sub-line 20 is connected to the one end E3 of the sub-line 21. With this arrangement, when the main lines 10 and 11 are arranged such that the directions of travel of traveling waves in the respective bands are substantially identical, the detector line L1 does not cross, unlike a reference example illustrated in FIG. 6 described below. Thus, also in this arrangement, the bidirectional coupler 110A more easily maintains high directivity than in a configuration in which a detector line crosses, and can thus improve detection accuracy.

In the arrangement described above, the detector line L1 and the line L2 cross. However, in this embodiment, in the forward operation modes, a signal transmitted on the detector line L1 and a signal transmitted on the line L2 are the same. Thus, if coupling between lines occurs, such coupling can less affect detection accuracy.

In the bidirectional coupler 110A, furthermore, the other end E2 of the sub-line 20 and the other end E4 of the sub-line 21 are located on the same side (on the positive X-axis side), and the termination circuit 40 is located in an area between the sub-line 20 and the sub-line 21. This arrangement provides a design that makes the distance from the sub-lines 20 and 21 to the termination circuit 40 short in the forward operation modes regardless of the frequency range used. Thus, the impedance value Z of the termination circuit 40 is easily determined.

The switch circuit 120 may also be located on the same semiconductor chip as that having the bidirectional coupler 110A, and the switch circuits 30 and 31 may be formed integrally with the switch circuit 120.

Further, the directional coupler including the main line 10 and the sub-line 20 and the directional coupler including the main line 11 and the sub-line 21 may not necessarily be formed on a semiconductor chip. For example, a directional coupler formed by a chip may be arranged on a substrate together with switch circuits and so on. Alternatively, a directional coupler may be formed by wiring on a substrate.

Figure 2:
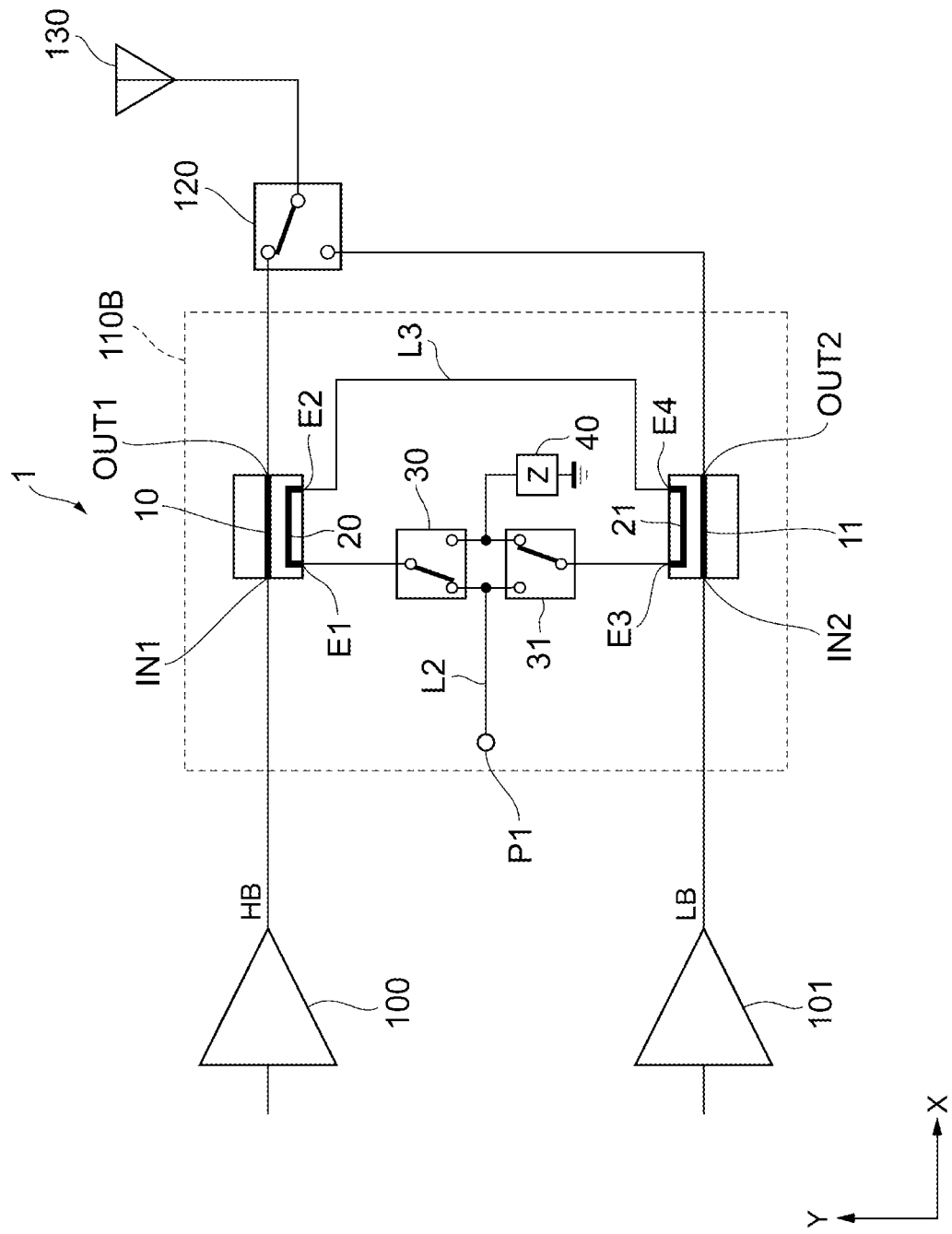
FIG. 2 illustrates an example configuration of a transmission unit including a bidirectional coupler according to a second embodiment of the present disclosure.

FIG. 2 illustrates an example configuration of a transmission unit including a bidirectional coupler according to a second embodiment of the present disclosure. The same or substantially the same elements as those in the transmission unit 1 illustrated in FIG. 1 are assigned the same numerals and will not be described herein. In the following embodiments, features common to the transmission unit 1 will not be described repeatedly, and only differences will be described. In particular, similar operational effects achieved with similar configurations will not be described again in the individual embodiments.

In a bidirectional coupler 110B illustrated in FIG. 2, the sub-lines 20 and 21 are connected and arranged in a different manner from that in the bidirectional coupler 110A.

Specifically, in the bidirectional coupler 110B, the other end E2 of the sub-line 20 and the other end E4 of the sub-line 21 are connected to each other. That is, the sub-lines 20 and 21 are portions of a single detector line L3, and both a traveling wave and a reflected wave are detected by using the detector line L3. The detector line L3 is a line extending from the switch circuit 30 to the switch circuit 31 via the one end E1 and the other end E2 of the sub-line 20 and the other end E4 and the one end E3 of the sub-line 21. The detector line L3 has an end (i.e., the one end E1 of the sub-line 20) connected to the input terminal of the switch circuit 30 and another end (i.e., the one end E3 of the sub-line 21) connected to the input terminal of the switch circuit 31.

The switch circuits 30 and 31 are switched between in a manner opposite to that of the switch circuits 30 and 31 in the bidirectional coupler 110A illustrated in FIG. 1. That is, for example, when the bidirectional coupler 110B is in an operation mode (first operation mode) for detecting a high-band traveling wave, the output terminal of the switch circuit 30 is switched to the detector port P1 side, and the output terminal of the switch circuit 31 is switched to the termination circuit 40 side (see FIG. 2). Thus, the one end E1 of the sub-line 20 is connected to the detector port P1 via the switch circuit 30 and the line L2. The other end E2 of the sub-line 20 is connected to the termination circuit 40 via the other sub-line 21 and the switch circuit 31. Also in the other operation modes, the switching manner is opposite to that in the bidirectional coupler 110A and will not be described in detail herein.

With the configuration described above, the bidirectional coupler 110B can also detect bidirectional (forward and reverse) signals in two frequency ranges by using the single detector line L3 in a way similar to that in the bidirectional coupler 110A.

As illustrated in FIG. 2, in the bidirectional coupler 110B, furthermore, the relative arrangement relationship among the switch circuits 30 and 31, the termination circuit 40, and the detector port P1 is similar to that in the bidirectional coupler 110A illustrated in FIG. 1, whereas the arrangement relationship with the detector line L3 is different from that with the detector line L1. Specifically, in the bidirectional coupler 110B, a line connecting the other end E2 of the sub-line 20 and the other end E4 of the sub-line 21 is located on the side of the termination circuit 40 in the direction of travel of a traveling wave (i.e., on the positive X-axis side of the termination circuit 40). In other words, the termination circuit 40 is located between the line connecting the other end E2 of the sub-line 20 and the other end E4 of the sub-line 21 and the switch circuits 30 and 31. This arrangement can prevent the detector line L3 from crossing the main lines 10 and 11, prevent the detector line L3 from crossing, and prevent the detector line L3 from crossing the line L2 on the semiconductor chip (not illustrated). That is, the bidirectional coupler 110B can detect a signal regardless of the frequency range and the direction (forward or reverse) while preventing coupling between lines. Thus, the bidirectional coupler 110B can further improve detection accuracy, compared with the bidirectional coupler 110A.

Figure 3:
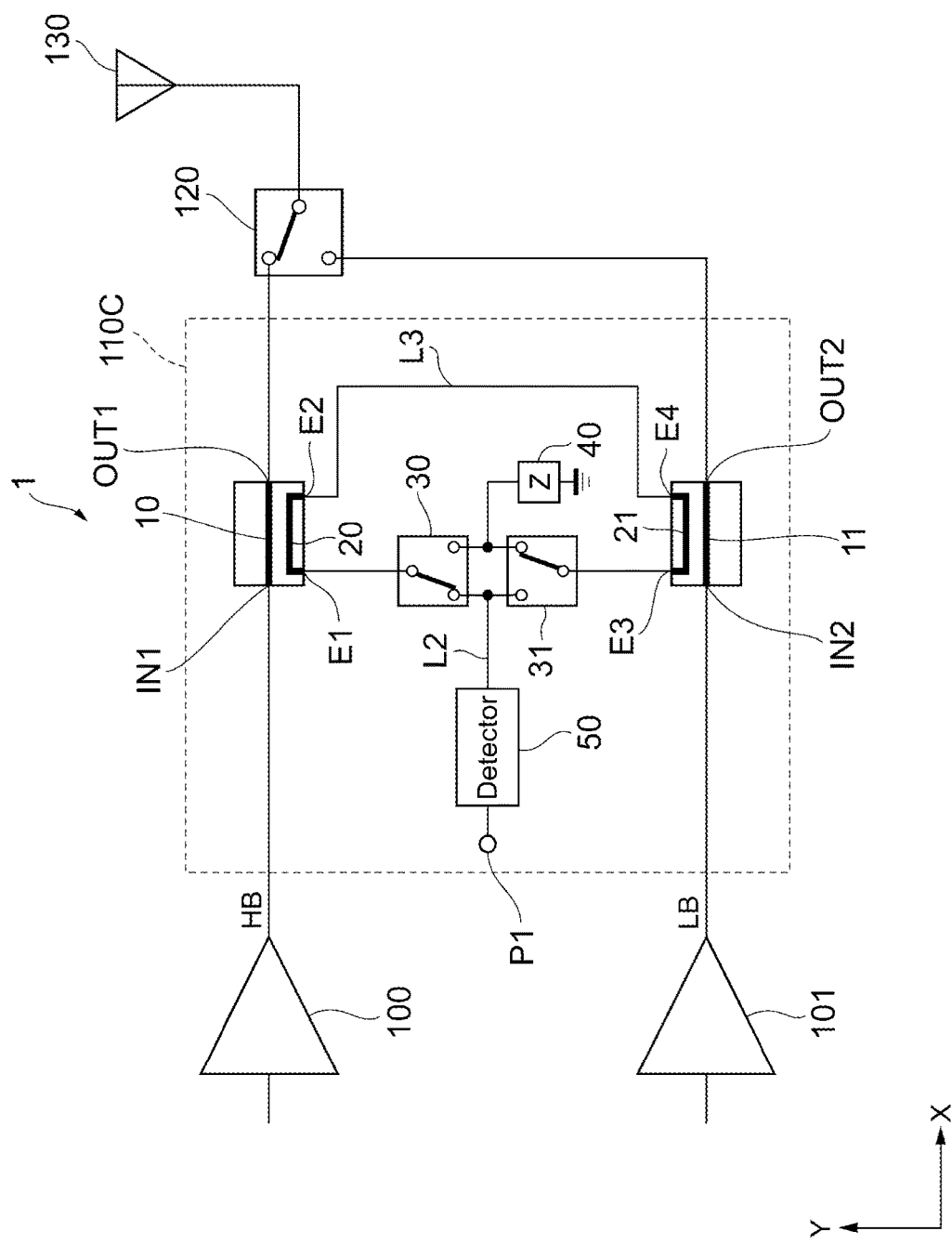
FIG. 3 illustrates an example configuration of a transmission unit including a bidirectional coupler according to a third embodiment of the present disclosure.

FIG. 3 illustrates an example configuration of a transmission unit including a bidirectional coupler according to a third embodiment of the present disclosure. Unlike the bidirectional coupler 110B, a bidirectional coupler 110C illustrated in FIG. 3 further includes a detector circuit 50.

The detector circuit 50 is disposed between the detector port P1 and one of the output terminals of each of the switch circuits 30 and 31 closer to the detector port P1. The detector circuit 50 detects the signal levels of detection signals of a high-band traveling wave and reflected wave and a low-band traveling wave and reflected wave, which are supplied via the switch circuits 30 and 31, and outputs signals to the detector port P1. The detector circuit 50 is formed on the same semiconductor chip as that having the switch circuits 30 and 31 included in the bidirectional coupler 110C, for example.

Specifically, for example, the detector circuit 50 converts a detection signal, which is a weak high-frequency signal susceptible to noise, into a direct-current voltage having a sufficiently larger amplitude than noise and outputs the direct-current voltage to the detector port P1. In the bidirectional coupler 110C, the detector circuit 50 having the configuration described above is formed on the semiconductor chip, thereby reducing the length of a line along which a detection signal can be affected by noise, compared with a configuration in which a detector circuit is disposed outside the semiconductor chip. Thus, the bidirectional coupler 110C can further improve detection accuracy, compared with the bidirectional coupler 110B. The detector circuit 50 may be an analog-to-digital (AD) converter that converts a detection signal, which is an analog signal, into a digital signal and that outputs the digital signal to the detector port P1.

Figure 4:
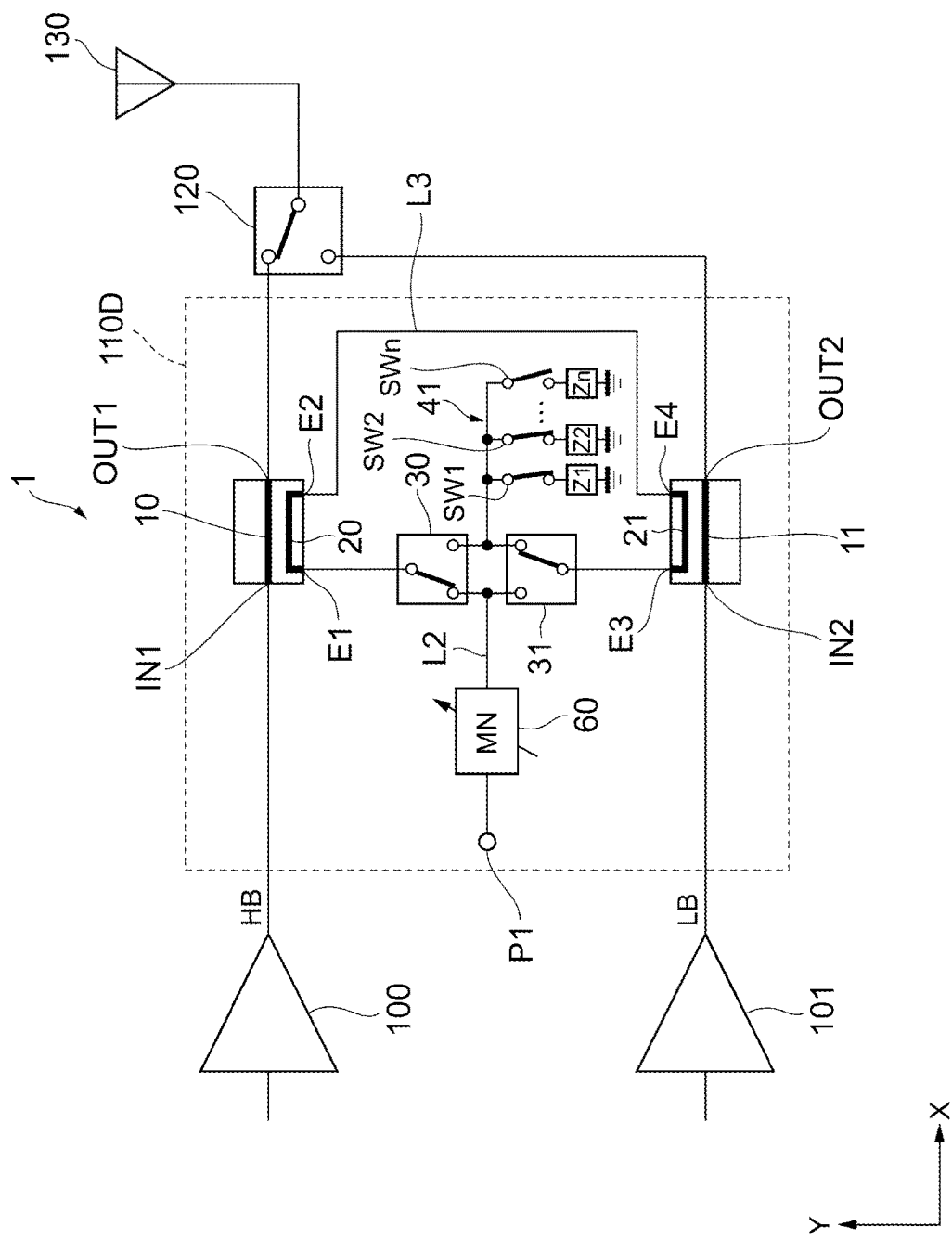
FIG. 4 illustrates an example configuration of a transmission unit including a bidirectional coupler according to a fourth embodiment of the present disclosure.

FIG. 4 illustrates an example configuration of a transmission unit including a bidirectional coupler according to a fourth embodiment of the present disclosure. Unlike the bidirectional coupler 110B, a bidirectional coupler 110D illustrated in FIG. 4 includes a termination circuit 41 in place of the termination circuit 40 and further includes a matching network 60.

The termination circuit 41 includes, for example, n loads Z1 to Zn and n switches SW1 to SWn, where n is an integer greater than or equal to 2. The loads Z1 to Zn are connected in parallel between output terminals of the switch circuits 30 and 31 and ground. The switches SW1 to SWn are connected in series with the loads Z1 to Zn, respectively, and the on and off states of each of the switches SW1 to SWn are controlled in accordance with a control signal supplied from outside the bidirectional coupler 110D. Accordingly, the combination of the loads Z1 to Zn connected in parallel is changed, and the combined impedance value of the termination circuit 41 is adjusted. That is, the loads Z1 to Zn and the switches SW1 to SWn constitute a specific example of a variable resistor (first variable resistor).

The matching network 60 is disposed between output terminals of the switch circuits 30 and 31 and the detector port P1. The matching network 60 converts an impedance value on the detector port P1 side, viewed from outside the bidirectional coupler 110D, to suppress return loss at the detector port P1. The matching network 60 may have a fixed or variable impedance value. When the matching network 60 has a variable impedance value, the impedance value of the matching network 60 is adjusted in accordance with, for example, the operation mode or the frequency of the traveling wave, thereby converting the impedance value on the detector port P1 side, viewed from outside the bidirectional coupler 110D, into a desired value (for example, approximately 50Ω) regardless of the frequency range and the direction of the detection signal.

As described above, the bidirectional coupler 110D includes the termination circuit 41 having a variable impedance value and can thus adjust the impedance value of the termination circuit 41 in accordance with the operation mode or the frequency of the traveling wave. Thus, isolation and directivity can be improved, compared with a configuration in which the impedance value of the termination circuit is fixed. Directivity is a measure, in decibels (dB), represented as a value obtained by subtracting the degree of coupling from isolation. In addition, the bidirectional coupler 110D includes the matching network 60 having a variable impedance value, thereby suppressing an increase in return loss at the detector port P1. Thus, the bidirectional coupler 110D can further improve detection accuracy, compared with the bidirectional coupler 110B.

The configuration of the termination circuit 41 illustrated in FIG. 4 is illustrative but not restrictive. For example, a termination circuit may include at least one of a variable capacitor (first variable capacitor), a variable inductor (first variable inductor), or a variable resistor (first variable resistor), and at least one of the capacitance value of the variable capacitor, the inductance value of the variable inductor, or the resistance value of the variable resistor may be controlled.

The matching network 60 may include, for example, at least one of a variable capacitor (second variable capacitor), a variable inductor (second variable inductor), or a variable resistor (second variable resistor), and at least one of the capacitance value of the variable capacitor, the inductance value of the variable inductor, or the resistance value of the variable resistor may be controlled.

Furthermore, as described above, when the impedance value of the termination circuit 41 is variable, the impedance value of the matching network 60 may be adjusted in accordance with the impedance value of the termination circuit 41. This can suppress an increase in return loss at the detector port P1 while improving directivity and isolation.

In FIG. 4, furthermore, both the termination circuit 41 and the matching network 60 have a variable impedance value. In an alternative configuration, any one of the termination circuit 41 and the matching network 60 may have a fixed impedance value. Alternatively, the bidirectional coupler 110D may not necessarily include the matching network 60. The bidirectional coupler 110D may further include the detector circuit 50 illustrated in FIG. 3.

Figure 5:
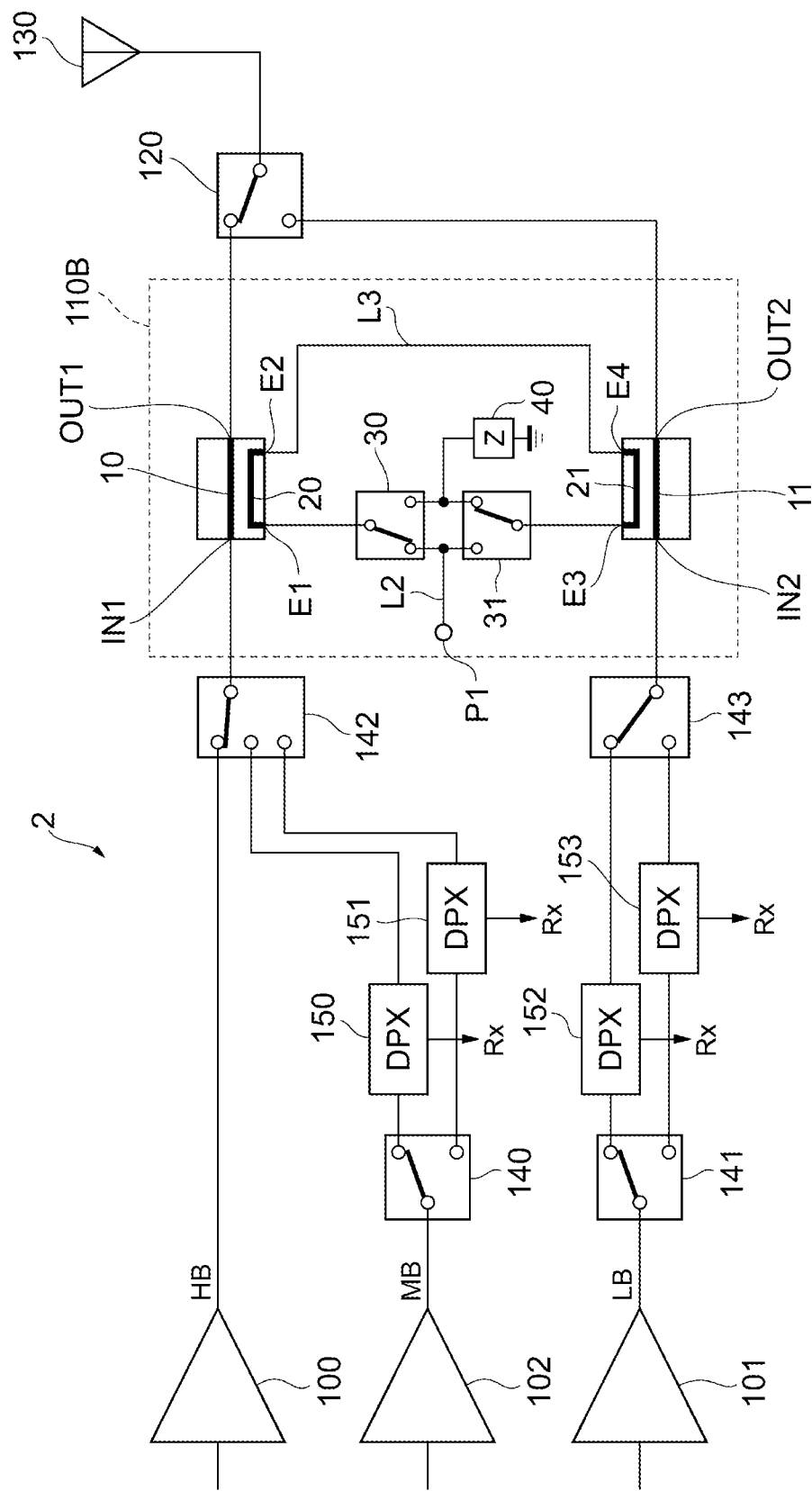
FIG. 5 illustrates another example configuration of the transmission unit including the bidirectional coupler according to the second embodiment of the present disclosure.

FIG. 5 illustrates another example configuration of the transmission unit including the bidirectional coupler according to the second embodiment of the present disclosure. A transmission unit 2 illustrated in FIG. 5 is different from the transmission unit 1 illustrated in FIG. 1 in that the transmission unit 2 is capable of detecting signals in three frequency ranges by using a configuration similar to that of the bidirectional coupler 110B.

Specifically, unlike the transmission unit 1, the transmission unit 2 includes an amplifier 102, switch circuits 140 to 143, and duplexers 150 to 153.

The amplifier 102 amplifies, for example, the power of an RF signal in a frequency range different from that in the amplifiers 100 and 101 and outputs the amplified signal. In the following description, the amplifier 102 is assumed to amplify a middle-band RF signal. The amplifiers 100 to 102 are switched so that two or more amplifiers are not simultaneously in the on state in such a manner that when one of the amplifiers 100 to 102 is in the on state, the other amplifiers are in the off state. The frequency range of a signal to be amplified by the amplifier 102 is an example and is not limited to the middle band.

The switch circuits 140 and 141 switch a middle-band traveling wave output from the amplifier 102 and a low-band transmit signal output from the amplifier 101, respectively, in accordance with the frequency and output signals to the duplexers 150 to 153.

The duplexers 150 to 153 separate transmit signals output from the switch circuits 140 and 141 and receive signals Rx output from the antenna 130 via the switch circuit 120, the bidirectional coupler 110B, and the switch circuits 142 and 143. The receive signals Rx will not be described herein.

The switch circuit 142 is a single-pole 3-throw (SP3T) switch. The switch circuit 142 gathers and outputs, from a single output terminal, a high-band transmit signal and a plurality of middle-band transmit signals output via the duplexers 150 and 151. Thus, both high-band and middle-band transmit signals are gathered and output to the main line 10 in the bidirectional coupler 110B.

The switch circuit 143 is a single-pole double-throw (SPDT) switch. The switch circuit 143 gathers and outputs a plurality of low-band transmit signals from a single output terminal. Thus, low-band transmit signals are gathered and output to the main line 11 in the bidirectional coupler 110B.

As described above, in the transmission unit 2 including the switch circuits 142 and 143, transmit signals in three or more paths are gathered into two paths and are output to the bidirectional coupler 110B. In other words, as illustrated in FIG. 5, since the switch circuits 142 and 143 are disposed upstream of the bidirectional coupler 110B, the bidirectional coupler 110B can be used to detect transmit signals in three or more paths.

If a bidirectional coupler includes only one coupler, a switch circuit (corresponding to the switch circuits 142 and 143 in FIG. 5) disposed upstream of the bidirectional coupler needs to gather the signals in all the frequency ranges into one path and to output the signals. In this case, the frequency range to be supported by the coupler is comparatively wide, and it is difficult to improve the isolation and directivity of the coupler over a wide range. In addition, the switch circuit disposed upstream of the bidirectional coupler has a larger number of ports (such as SPST), and thus signal loss in the switch circuit is increased.

In this embodiment, the bidirectional coupler 110B includes two couplers, and the frequency range to be supported by each of the couplers is comparatively narrow. Thus, the isolation and directivity of each coupler is likely to be improved. In addition, signal loss in the couplers and the switch circuits 142 and 143 is reduced. Thus, the output power of the amplifiers 100 to 102 can be kept lower than that in a configuration including only one coupler, resulting in a reduction in current consumption of the transmission unit 2.

The switch circuits 142 and 143 may also be located on the same semiconductor chip as that having the bidirectional coupler 110B, and the switch circuits 30 and 31 may be formed integrally with the switch circuits 142 and 143.

Further, the method illustrated in FIG. 5 for gathering high-band, middle-band, and low-band signals and the number of frequency ranges are illustrative but not restrictive. For example, a high-band transmit signal may be output to the main line 10, and middle-band and low-band transmit signals may be gathered and output to the main line 11. In an alternative configuration, a switch circuit and duplexers may also be disposed for the high band in a manner similar to that for the middle band and the low band to separate high-band transmit signals into a plurality of paths in accordance with the frequency.

The bidirectional coupler used in the transmission unit 2 is an example, and the transmission unit 2 may include a bidirectional coupler according to any other embodiment instead of the bidirectional coupler 110B.

The transmission unit 2 may include, instead of the switch circuit 120, a diplexer that transmits signals in the middle-band and high-band frequency ranges among signals supplied from the switch circuit 142 to the antenna 130 and that transmits a signal in the low-band frequency range among signals supplied from the switch circuit 143 to the antenna 130. Alternatively, the transmission unit 2 may include, instead of the switch circuit 120 and the antenna 130, separate antennas, namely, an antenna for the middle band and the high band, and an antenna for the low band. The configurations described above enable, as in the first embodiment, time-division detection of low-band and middle-band or high-band signals by switching the switch circuits 30 and 31 in the bidirectional coupler 110B by time while simultaneously operating the amplifier 101 for the low band and the amplifier 102 or 100 for the middle band or the high band.

Figure 6:
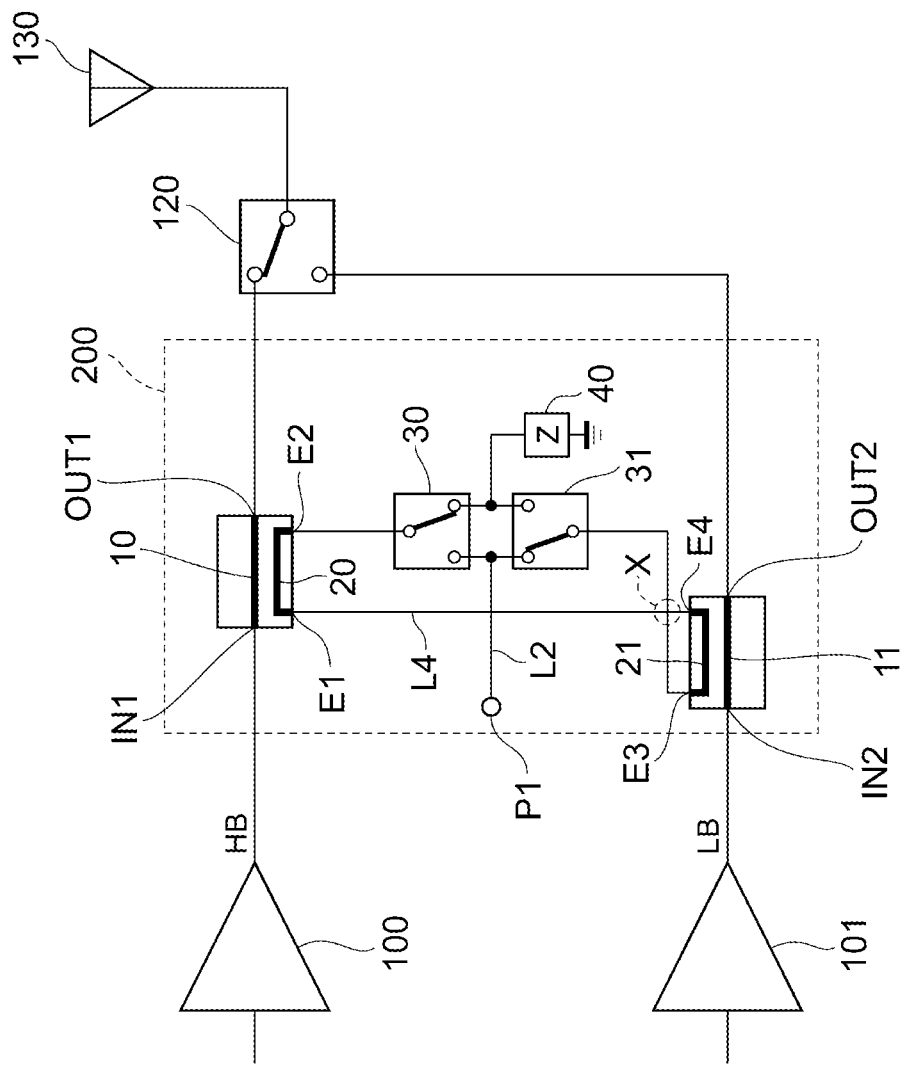
FIG. 6 illustrates an example configuration of a transmission unit including a bidirectional coupler according to a reference example of the present disclosure.

FIG. 6 illustrates an example configuration of a transmission unit including a bidirectional coupler according to a reference example of the present disclosure. A bidirectional coupler 200 illustrated in FIG. 6 is different from the bidirectional coupler 110A in the connection configuration of the sub-line 20 and the sub-line 21.

Specifically, in the bidirectional coupler 200, the one end E1 of the sub-line 20 and the other end E4 of the sub-line 21 are connected to each other. That is, the sub-lines 20 and 21 are portions of a single detector line L4, and both a traveling wave and a reflected wave are detected by using the detector line L4. The detector line L4 is a line extending from the switch circuit 30 to the switch circuit 31 via the other end E2 and the one end E1 of the sub-line 20 and the other end E4 and the one end E3 of the sub-line 21. The detector line L4 has an end (i.e., the other end E2 of the sub-line 20) connected to the input terminal of the switch circuit 30 and another end (i.e., the one end E3 of the sub-line 21) connected to the input terminal of the switch circuit 31.

The switch circuits 30 and 31 are switched between in a manner similar to that in the bidirectional coupler 110A in an operation mode for detecting a high-band traveling wave and reflected wave and in a manner opposite to that in the bidirectional coupler 110A in an operation mode for detecting a low-band traveling wave and reflected wave. That is, for example, when the bidirectional coupler 200 is in an operation mode (third operation mode) for detecting a low-band traveling wave, the output terminal of the switch circuit 30 is switched to the termination circuit 40 side, and the output terminal of the switch circuit 31 is switched to the detector port P1 side (see FIG. 6). Thus, the one end E3 of the sub-line 21 is connected to the detector port P1 via the switch circuit 31 and the line L2. The other end E4 of the sub-line 21 is connected to the termination circuit 40 via the other sub-line 20 and the switch circuit 30. In contrast, when the bidirectional coupler 200 is in an operation mode (fourth operation mode) for detecting a low-band reflected wave, the output terminal of the switch circuit 30 is switched to the detector port P1 side, and the output terminal of the switch circuit 31 is switched to the termination circuit 40 side. Thus, the one end E3 of the sub-line 21 is connected to the termination circuit 40 via the switch circuit 31. The other end E4 of the sub-line 21 is connected to the detector port P1 via the other sub-line 20, the switch circuit 30, and the line L2. In the other operation modes, the switching manner is similar to that in the bidirectional coupler 110A and will not be described in detail herein.

Also in this configuration, the bidirectional coupler 200 can detect bidirectional (forward and reverse) signals in two frequency ranges by using the single detector line L4 in a way similar to that in the bidirectional coupler 110A.

In this reference example, furthermore, when the constituent elements included in the bidirectional coupler 200 are arranged in the manner illustrated in FIG. 6, the single detector line L4 crosses at a crossing point X. In an operation mode for detecting a high-band traveling wave and reflected wave, signals transmitted on crossing portions of the detector line L4 at the crossing point X are the same and are thus less affected by coupling between the line portions. In an operation mode for detecting a low-band traveling wave and reflected wave, in contrast, signals transmitted on the crossing portions of the single detector line L4 at the crossing point X are different and may thus be affected by coupling between the line portions. The coupling between lines is lower when signals transmitted on the lines have a lower frequency. In this reference example, portions of the sub-line 21 on the low-band side having a comparatively low frequency, which are respectively connected to the one end E3 and the other end E4, cross. Thus, an influence of coupling between the line portions at the crossing point X is reduced, compared with a configuration in which portions of the sub-line 20 on the high-band side, which are respectively connected to the one end E1 and the other end E2, cross.

As in the bidirectional couplers 110C and 110D, the bidirectional coupler 200 may also include the detector circuit 50 and the termination circuit 41 or the matching network 60 having a variable impedance value.

The foregoing has described exemplary embodiments of the present disclosure. The bidirectional coupler 110A includes the main lines 10 and 11, the sub-lines 20 and 21, the detector port P1, the termination circuit 40, and the switch circuits 30 and 31. The one end E1 of the sub-line 20 and the one end E3 of the sub-line 21 are connected to each other. In the detection of a high-band transmit signal or a low-band reflected signal, the switch circuits 30 and 31 connect the other end E2 of the sub-line 20 to the termination circuit 40 and connect the other end E4 of the sub-line 21 to the detector port P1. In the detection of a high-band reflected signal or a low-band transmit signal, the switch circuits 30 and 31 connect the other end E2 of the sub-line 20 to the detector port P1 and connect the other end E4 of the sub-line 21 to the termination circuit 40. Thus, bidirectional (forward and reverse) signals in two frequency ranges can be detected by using the single detector line L1.

In the bidirectional coupler 110A, the main lines 10 and 11 are located approximately parallel to each other such that the directions of travel of traveling waves in the respective bands are substantially identical, the sub-lines 20 and 21 are located in an area between the main lines 10 and 11, the switch circuits 30 and 31 are located in an area between the sub-lines 20 and 21, the termination circuit 40 is located on the side of the switch circuits 30 and 31 in the directions of travel of the traveling waves, and the detector port P1 is located on the side of the switch circuits 30 and 31 in a direction opposite to the directions of travel of the traveling waves. This configuration prevents the main lines 10 and 11 from crossing the detector line L1 and prevents the detector line L1 from crossing. Thus, detection accuracy can be improved, compared with a configuration in which lines cross.

Further, the bidirectional couplers 110B to 110D include the main lines 10 and 11, the sub-lines 20 and 21, the detector port P1, the termination circuit 40, and the switch circuits 30 and 31. The other end E2 of the sub-line 20 and the other end E4 of the sub-line 21 are connected to each other. In the detection of a high-band transmit signal or a low-band reflected signal, the switch circuits 30 and 31 connect the one end E1 of the sub-line 20 to the detector port P1 and connect the one end E3 of the sub-line 21 to the termination circuit 40. In the detection of a high-band reflected signal or a low-band transmit signal, the switch circuits 30 and 31 connect the one end E1 of the sub-line 20 to the termination circuit 40 and connect the one end E3 of the sub-line 21 to the detector port P1. Thus, bidirectional (forward and reverse) signals in two frequency ranges can be detected by using the single detector line L3.

In the bidirectional couplers 110B to 110D, the main lines 10 and 11 are located approximately parallel to each other such that the directions of travel of traveling waves in the respective bands are substantially identical, the sub-lines 20 and 21 are located in an area between the main lines 10 and 11, the switch circuits 30 and 31 are located in an area between the sub-lines 20 and 21, the termination circuit 40 is located between a line connecting the other end E2 of the sub-line 20 and the other end E4 of the sub-line 21 and the switch circuits 30 and 31, and the detector port P1 is located on the side of the switch circuits 30 and 31 in a direction opposite to the directions of travel of the traveling waves. This configuration prevents the main lines 10 and 11 from crossing the detector line L3, prevents the detector line L3 from crossing, and, additionally, prevents the detector line L3 and the line L2 from crossing. Thus, detection accuracy can be improved, compared with a configuration in which lines cross.

The bidirectional coupler 110C further includes the detector circuit 50 between the switch circuits 30 and 31 and the detector port P1, and the detector circuit 50 converts a detection signal into a direct-current voltage and outputs the direct-current voltage to the detector port P1. This configuration reduces the length of a line along which a detection signal can be affected by noise. Thus, detection accuracy can be improved.

In the bidirectional coupler 110C, furthermore, the detector circuit 50 is formed on a semiconductor chip having the switch circuits 30 and 31. This configuration can further improve detection accuracy, compared with a configuration in which a detector circuit is disposed outside the semiconductor chip.

In the bidirectional coupler 110D, the termination circuit 41 includes a variable resistor among a variable capacitor, a variable inductor, and the variable resistor, and the resistance value of the variable resistor is controlled in accordance with the operation mode or the frequency. This configuration can adjust the impedance value of the termination circuit 41 in accordance with the operation mode or the frequency. Thus, isolation and directivity can be improved, compared with a configuration in which the impedance value of the termination circuit 41 is fixed.

The bidirectional coupler 110D further includes the matching network 60 between the switch circuits 30 and 31 and the detector port P1. The matching network 60 includes at least one of a variable capacitor, a variable inductor, or a variable resistor, and at least one of the capacitance value of the variable capacitor, the inductance value of the variable inductor, or the resistance value of the variable resistor is controlled in accordance with the operation mode or the frequency. This configuration suppresses an increase in return loss at the detector port P1. Thus, the bidirectional coupler 110D can further improve detection accuracy, compared with a configuration that does not include the matching network 60.

While a configuration in which the bidirectional couplers 110A to 110D and 200 include two sets of main lines and sub-lines is disclosed herein, a bidirectional coupler may include three or more sets of main lines and sub-lines.

The embodiments described above are intended to help easily understand the present disclosure and are not to be used to construe the present disclosure in a limiting fashion. The present disclosure may be modified or improved without departing from the gist thereof, and equivalents of such modifications or improvements are also included in the present disclosure. That is, the embodiments may be appropriately modified in design by those skilled in the art, and such modifications also fall within the scope of the present disclosure so long as the modifications include the features of the present disclosure. For example, elements included in the embodiments and the arrangements, materials, conditions, shapes, sizes, and so on thereof are not limited to those illustrated exemplarily but can be modified as appropriate. Elements included in the embodiments can be combined as much as technically possible, and such combinations of elements also fall within the scope of the present disclosure so long as the combinations of elements include the features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A bidirectional coupler comprising:
   a first main line having a first input end and a first output end, and that is configured to transmit a first signal from the first input end to the first output end;
   a second main line having a second input end and a second output end, and that is configured to transmit a second signal from the second input end to the second output end;
   a first sub-line electromagnetically coupled to the first main line, the first sub-line having a first end corresponding to the first input end and a second end corresponding to the first output end;
   a second sub-line electromagnetically coupled to the second main line, the second sub-line having a first end corresponding to the second input end and a second end corresponding to the second output end;
   a detector port;
   a termination circuit; and
   a switch circuit configured to selectively connect each of the second end of the first sub-line and the second end of the second sub-line to the detector port or to the termination circuit in accordance with an operation mode of the bidirectional coupler,
   wherein the first end of the first sub-line and the first end of the second sub-line are connected to each other,
   wherein in a first operation mode the bidirectional coupler is configured to detect the first signal, in a second operation mode the bidirectional coupler is configured to detect a reflected signal of the first signal, in a third operation mode the bidirectional coupler is configured to detect the second signal, and in a fourth operation mode the bidirectional coupler is configured to detect a reflected signal of the second signal,
   wherein when the bidirectional coupler is in the first operation mode or the fourth operation mode, the switch circuit is configured to connect the second end of the first sub-line to the termination circuit and to connect the second end of the second sub-line to the detector port, and
   wherein when the bidirectional coupler is in the second operation mode or the third operation mode, the switch circuit is configured to connect the second end of the first sub-line to the detector port and to connect the second end of the second sub-line to the termination circuit.

2. The bidirectional coupler according to claim 1, further comprising a substrate,
   wherein the first main line and the second main line are arranged on the substrate to be approximately parallel to each other such that a direction of travel of the first signal and a direction of travel of the second signal are substantially parallel,
   wherein the first sub-line and the second sub-line are arranged in an area of the substrate between the first main line and the second main line,
   wherein the switch circuit is arranged in an area of the substrate between the first sub-line and the second sub-line,
   wherein the termination circuit is arranged in the area of the substrate between the first sub-line and the second sub-line, and is arranged on a side of the switch circuit nearest the first output end and the second output end, and
   wherein the detector port is arranged in the area of the substrate between the first sub-line and the second sub-line, and is arranged on a side of the switch circuit nearest the first input end and the second input end.

3. The bidirectional coupler according to claim 2, further comprising:
   a detector circuit disposed between the switch circuit and the detector port,
   wherein the detector circuit is configured to convert a detection signal into a direct-current voltage and to output the direct-current voltage to the detector port, and
   wherein the detection signal is based on the operation mode of the bidirectional coupler, and is the first signal, the reflected signal of the first signal, the second signal, or the reflected signal of the second signal.

4. The bidirectional coupler according to claim 2, wherein the termination circuit comprises a first variable capacitor, a first variable inductor, or a first variable resistor, and
   wherein at least one of a capacitance value of the first variable capacitor, an inductance value of the first variable inductor, or a resistance value of the first variable resistor is controlled in accordance with the operation mode of the bidirectional coupler, a frequency of the first signal, or a frequency of the second signal.

5. The bidirectional coupler according to claim 2, further comprising:
   a matching network disposed between the switch circuit and the detector port,
   wherein the matching network comprises a second variable capacitor, a second variable inductor, or a second variable resistor, and
   wherein at least one of a capacitance value of the second variable capacitor, an inductance value of the second variable inductor, or a resistance value of the second variable resistor is controlled in accordance with the operation mode of the bidirectional coupler, a frequency of the first signal, or a frequency of the second signal.

6. The bidirectional coupler according to claim 1, further comprising:
a detector circuit disposed between the switch circuit and the detector port,
wherein the detector circuit is configured to convert a detection signal into a direct-current voltage and to output the direct-current voltage to the detector port, and
wherein the detection signal is based on the operation mode of the bidirectional coupler, and is the first signal, the reflected signal of the first signal, the second signal, or the reflected signal of the second signal.

7. The bidirectional coupler according to claim 6, wherein the detector circuit is formed on a semiconductor chip having the switch circuit.

8. The bidirectional coupler according to claim 1, wherein the termination circuit comprises a first variable capacitor, a first variable inductor, or a first variable resistor, and
wherein at least one of a capacitance value of the first variable capacitor, an inductance value of the first variable inductor, or a resistance value of the first variable resistor is controlled in accordance with the operation mode of the bidirectional coupler, a frequency of the first signal, or a frequency of the second signal.

9. The bidirectional coupler according to claim 1, further comprising:
a matching network disposed between the switch circuit and the detector port,
wherein the matching network comprises a second variable capacitor, a second variable inductor, or a second variable resistor, and
wherein at least one of a capacitance value of the second variable capacitor, an inductance value of the second variable inductor, or a resistance value of the second variable resistor is controlled in accordance with the operation mode of the bidirectional coupler, a frequency of the first signal, or a frequency of the second signal.

10. A bidirectional coupler comprising:
a first main line having a first input end and a first output end, and that is configured to transmit a first signal from the first input end to the first output end;
a second main line having a second input end and a second output end, and that is configured to transmit a second signal from the second input end to the second output end;
a first sub-line electromagnetically coupled to the first main line, the first sub-line having a first end corresponding to the first input end and a second end corresponding to the first output end;
a second sub-line electromagnetically coupled to the second main line, the second sub-line having a first end corresponding to the second input end and a second end corresponding to the second output end;
a detector port;
a termination circuit; and
a switch circuit configured to selectively connect each of the first end of the first sub-line and the first end of the second sub-line to the detector port or to the termination circuit in accordance with an operation mode of the bidirectional coupler,
wherein the second end of the first sub-line and the second end of the second sub-line are connected to each other,
wherein in a first operation mode the bidirectional coupler is configured to detect the first signal, in a second operation mode the bidirectional coupler is configured to detect a reflected signal of the first signal, in a third operation mode the bidirectional coupler is configured to detect the second signal, and in a fourth operation mode the bidirectional coupler is configured to detect a reflected signal of the second signal,
wherein when the bidirectional coupler is in the first operation mode or the fourth operation mode, the switch circuit is configured to connect the first end of the first sub-line to the detector port and to connect the first end of the second sub-line to the termination circuit, and
when the bidirectional coupler is in the second operation mode or the third operation mode, the switch circuit is configured to connect the first end of the first sub-line to the termination circuit and to connect the first end of the second sub-line to the detector port.

11. The bidirectional coupler according to claim 10, further comprising a substrate,
wherein the first main line and the second main line are arranged on the substrate to be approximately parallel to each other such that a direction of travel of the first signal and a direction of travel of the second signal are substantially parallel,
wherein the first sub-line and the second sub-line are arranged in an area of the substrate between the first main line and the second main line,
wherein the switch circuit is arranged in an area of the substrate between the first sub-line and the second sub-line,
wherein the termination circuit is arranged in the area of the substrate between the first sub-line and the second sub-line, and is arranged between the switch circuit and a transmission line connecting the second end of the first sub-line and the second end of the second sub-line, and
wherein the detector port is arranged in the area of the substrate between the first sub-line and the second sub-line, and is arranged on a side of the switch circuit nearest the first input end and the second input end.

12. The bidirectional coupler according to claim 11, further comprising:
a detector circuit disposed between the switch circuit and the detector port,
wherein the detector circuit is configured to convert a detection signal into a direct-current voltage and to output the direct-current voltage to the detector port, and
wherein the detection signal is based on the operation mode of the bidirectional coupler, and is the first signal, the reflected signal of the first signal, the second signal, or the reflected signal of the second signal.

13. The bidirectional coupler according to claim 11, wherein the termination circuit comprises a first variable capacitor, a first variable inductor, or a first variable resistor, and
wherein at least one of a capacitance value of the first variable capacitor, an inductance value of the first variable inductor, or a resistance value of the first variable resistor is controlled in accordance with the operation mode of the bidirectional coupler, a frequency of the first signal, or a frequency of the second signal.

14. The bidirectional coupler according to claim 11, further comprising:
a matching network disposed between the switch circuit and the detector port, wherein the matching network comprises a second variable capacitor, a second variable inductor, or a second variable resistor, and wherein at least one of a capacitance value of the second variable capacitor, an inductance value of the second variable inductor, or a resistance value of the second variable resistor is controlled in accordance with the operation mode of the bidirectional coupler, a frequency of the first signal, or a frequency of the second signal.

15. The bidirectional coupler according to claim 10, further comprising:

a detector circuit disposed between the switch circuit and the detector port, wherein the detector circuit is configured to convert a detection signal into a direct-current voltage and to output the direct-current voltage to the detector port, and wherein the detection signal is based on the operation mode of the bidirectional coupler, and is the first signal, the reflected signal of the first signal, the second signal, or the reflected signal of the second signal.

16. The bidirectional coupler according to claim 15, wherein the detector circuit is formed on a semiconductor chip having the switch circuit.

17. The bidirectional coupler according to claim 10, wherein the termination circuit comprises a first variable capacitor, a first variable inductor, or a first variable resistor, and wherein at least one of a capacitance value of the first variable capacitor, an inductance value of the first variable inductor, or a resistance value of the first variable resistor is controlled in accordance with the operation mode of the bidirectional coupler, a frequency of the first signal, or a frequency of the second signal.

18. The bidirectional coupler according to claim 10, further comprising:

a matching network disposed between the switch circuit and the detector port, wherein the matching network comprises a second variable capacitor, a second variable inductor, or a second variable resistor, and wherein at least one of a capacitance value of the second variable capacitor, an inductance value of the second variable inductor, or a resistance value of the second variable resistor is controlled in accordance with the operation mode of the bidirectional coupler, a frequency of the first signal, or a frequency of the second signal.

* * * * *